United States Patent
Kim et al.

(10) Patent No.: US 10,078,240 B2
(45) Date of Patent: *Sep. 18, 2018

(54) LIGHT CONTROL DEVICE, TRANSPARENT DISPLAY DEVICE INCLUDING THE SAME, AND METHOD OF MANUFACTURING THE SAME

(71) Applicant: LG DISPLAY CO., LTD., Seoul (KR)

(72) Inventors: Kihan Kim, Paju-si (KR); JiYoung Ahn, Goyang-si (KR); Moonsun Lee, Sejong (KR); Jae-Hyun Kim, Seoul (KR); Sunyoung Park, Paju-si (KR); Seokwon Ji, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/282,566

(22) Filed: Sep. 30, 2016

(65) Prior Publication Data

US 2017/0090237 A1    Mar. 30, 2017

(30) Foreign Application Priority Data

Sep. 30, 2015  (KR) ........................ 10-2015-0138180
Nov. 10, 2015  (KR) ........................ 10-2015-0157679

(51) Int. Cl.
  *G02F 1/1334*  (2006.01)
  *G02F 1/1347*  (2006.01)
  (Continued)

(52) U.S. Cl.
  CPC ........ *G02F 1/1334* (2013.01); *G02F 1/13471* (2013.01); *G02F 1/13475* (2013.01);
  (Continued)

(58) Field of Classification Search
  CPC ........... G02F 1/13471; G02F 1/133377; G02F 1/1337; G02F 1/1334
  See application file for complete search history.

(56) References Cited

U.S. PATENT DOCUMENTS 7,417,787 B2 * 8/2008 Chopra .................. G02F 1/167
                                                           359/290
8,867,120 B2 * 10/2014 O'Keeffe .............. G02F 1/1334
                                                           264/4.7

(Continued)

FOREIGN PATENT DOCUMENTS

| JP | 2006-330490 A | 12/2006 |
|---|---|---|
| KR | 10-2008-0094383 A | 10/2008 |
| KR | 10-2015-0007998 A | 1/2015 |

*Primary Examiner* — Dung Nguyen
(74) *Attorney, Agent, or Firm* — Birch, Stewart, Kolasch & Birch, LLP

(57) ABSTRACT

Discussed are a light control device, a transparent display device including the same, and a method of manufacturing the same, which lower a light transmittance in a light shield mode. The light control device may include a first substrate and a second substrate facing each other, a first electrode disposed on one surface of the first substrate facing the second substrate, a second electrode disposed on one surface of the second substrate facing the first substrate, a plurality of partition walls disposed on one surface of the first electrode facing the second substrate to maintain a gap between the first substrate and the second substrate, a first alignment layer disposed on the one surface of the first electrode and the plurality of partition walls, and a second alignment layer disposed on one surface of the second electrode facing the first substrate.

18 Claims, 15 Drawing Sheets

(51) Int. Cl.
  *G02F 1/1333*  (2006.01)
  *G02F 1/1337*  (2006.01)
  *H01L 27/32*  (2006.01)

(52) U.S. Cl.
  CPC ...... *G02F 1/133377* (2013.01); *G02F 1/1337* (2013.01); *G02F 2001/13345* (2013.01); *G02F 2001/133742* (2013.01); *G02F 2202/28* (2013.01); *H01L 27/32* (2013.01)

(56) References Cited

U.S. PATENT DOCUMENTS

| | | | |
|---|---|---|---|
| 9,594,286 B2 * | 3/2017 | Kim | H01L 51/5284 |
| 9,804,467 B2 * | 10/2017 | Kim | G02F 1/137 |
| 2006/0262249 A1 * | 11/2006 | Liang | G02F 1/133377 |
| | | | 349/86 |
| 2006/0285059 A1 | 12/2006 | Takagi et al. | |
| 2014/0085574 A1 * | 3/2014 | Kashima | G02F 1/1334 |
| | | | 349/86 |
| 2016/0062157 A1 * | 3/2016 | Kim | G02F 1/13394 |
| | | | 349/33 |
| 2016/0115389 A1 | 4/2016 | Lim et al. | |
| 2016/0154259 A1 * | 6/2016 | Kim | G02F 1/137 |
| | | | 257/40 |

* cited by examiner

LIGHT CONTROL DEVICE, TRANSPARENT DISPLAY DEVICE INCLUDING THE SAME, AND METHOD OF MANUFACTURING THE SAME

CROSS-REFERENCE TO RELATED APPLICATIONS

This application claims the benefit of the Korean Patent Application No. 10-2015-0138180 filed on Sep. 30, 2015 and No. 10-2015-0157679 filed on Nov. 10, 2015, is the contents of all these applications are hereby incorporated by reference as if fully set forth herein.

BACKGROUND

Field of the Invention

The present invention relates to a light control device, a transparent display device including the light control device, and a method of manufacturing the light control device.

Discussion of the Related Art

Recently, as the society advances to the information-oriented society, the display field of processing and displaying a massive amount of information is rapidly advancing, and correspondingly, various flat panel display (FPD) devices have been developed and are attracting much attention. Examples of the FPD devices include LCD devices, plasma display panel (PDP) devices, field emission display (FED) devices, electroluminescence display (ELD) devices, organic light emitting diode (OLED) display devices, etc.

Recently, display devices are becoming miniaturized, light, and lowered in consumption power, and thus, the application fields of the display devices are continuously increasing. Particularly, in most electronic devices or mobile devices, a display device is used as a type of user interface.

Moreover, transparent display devices which enable a user to look at a background or an object located behind the transparent display devices are being actively researched recently. The transparent display devices are good in space availability, interior, and design and may be applied to various fields. The transparent display devices realize an information recognition function, an information processing function, and an information display function by using a transparent electronic device, thereby solving the spatial limitation and visual limitation of electronic devices. For example, a transparent display device may be applied to windows of buildings or vehicles and thus may be implemented as a smart window which allows a background to be seen or displays an image.

A transparent display device may be implemented as an organic light emitting display device. In this case, power consumption is small, but a contrast ratio is not changed in a dark environment and is reduced in an environment having light. A contrast ratio based on the dark environment may be defined as a dark room contrast ratio, and a contrast ratio based on the environment having light may be defined as a bright room contrast ratio. That is, the transparent display device includes a transmissive area in order for a user to look at a background or an object located behind the transparent display device, and for this reason, the bright room contrast ratio is reduced. Therefore, in a case where the transparent display device is implemented as an organic light emitting display device, a light control device that realizes a light shield mode for blocking light and a transmissive mode for transmitting light is needed for preventing the bright room contrast ratio from being reduced.

Light control devices block most of light in the light shield mode, and for example, may be designed in order for a ratio (hereinafter referred to as a light transmittance) of incident light to output light to be equal to or less than $\alpha\%$. Also, the light control devices transmit most of light in the transmissive mode, and for example, may be designed in order for a light transmittance to be equal to or more than $\beta\%$. In this case, $\beta$ is greater than $\alpha$.

A light control device may be applied to polymer-dispersed LCD devices including liquid crystal and dichroic dyes. In this case, an ultraviolet (UV) curing process of curing a polymer of polymer-dispersed liquid crystal of the light control device is essential. When UV is irradiated onto the dichroic dyes in the UV curing process, the dichroic dyes are discolored, and for this reason, a dichroic ratio (DR) of the dichroic dyes is lowered. The DR may be defined as a long-axis direction absorption ratio of dichroic dyes or a short-axis direction absorption ratio of dichroic dyes. The long-axis direction absorption ratio of dichroic dyes denotes an absorption ratio of light L when dichroic dyes DD are aligned in a long-axis direction Ke as illustrated in FIG. 1A, and the short-axis direction absorption ratio of dichroic dyes denotes an absorption ratio of the light L when the dichroic dyes DD are aligned in a short-axis direction Ko as illustrated in FIG. 1B. As the DR is lowered, a light transmittance becomes higher than a target value "$\alpha\%$" in the light shield mode of the light control device, and for this reason, the light control device cannot normally block light.

SUMMARY

Accordingly, the present invention is directed to provide a light control device, a transparent display device including the same, and a method of manufacturing the light control device that substantially obviate one or more problems due to limitations and disadvantages of the related art.

An aspect of the present invention is directed to provide a light control device, a transparent display device including the same, and a method of manufacturing the transparent display device, which lower a light transmittance in a light shield mode.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a light control device including a first substrate and a second substrate facing each other, a first electrode disposed on one surface of the first substrate facing the second substrate, a second electrode disposed on one surface of the second substrate facing the first substrate, a plurality of partition walls disposed on one surface of the first electrode facing the second substrate to maintain a gap between the first substrate and the second substrate, a first alignment layer disposed on the one surface of the first electrode and the plurality of partition walls, and a second alignment layer disposed on one surface of the second electrode facing the first substrate.

In another aspect of the present invention, there is provided a transparent display device including a transparent display panel transmitting incident light or displaying an image and a light control device disposed on one surface of the transparent display panel, the light control device performing a transmissive mode, where the incident light is transmitted, and a light shield mode where the incident light is blocked. The light control device includes a first substrate and a second substrate facing each other, a first electrode disposed on one surface of the first substrate facing the second substrate, a second electrode disposed on one surface of the second substrate facing the first substrate, a plurality of partition walls disposed on one surface of the first electrode facing the second substrate to maintain a gap between the first substrate and the second substrate, a first alignment layer disposed on the one surface of the first electrode and the plurality of partition walls, and a second alignment layer disposed on one surface of the second electrode facing the first substrate.

In another aspect of the present invention, there is provided a method of manufacturing a light control device including forming a first electrode on one surface of a first substrate and forming a second electrode on one surface of a second substrate facing the first substrate, forming a partition wall on one surface of the first electrode, forming a first alignment layer on the one surface of the first electrode and the partition wall and forming a second alignment layer on one surface of the second electrode facing the first substrate, filling liquid crystal materials including liquid crystal, dichroic dyes, and ion materials into a plurality of areas divided by the partition wall, and attaching the first alignment layer on the second alignment layer to bond the first substrate to the second substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1A:
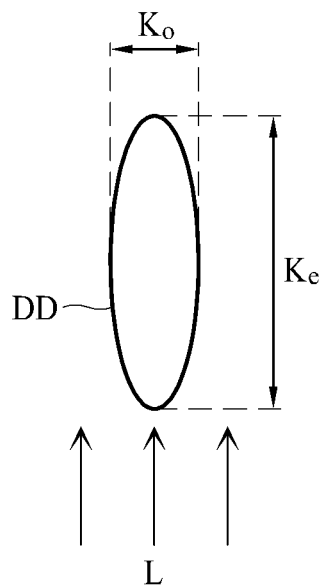
FIGS. 1A and 1B are exemplary diagrams respectively illustrating long-axis direction arrangement and short-axis direction arrangement of dichroic dyes according to a related art.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~%', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

An X axis direction, a Y axis direction, and a Z axis direction should not be construed as only a geometric relationship where a relationship therebetween is vertical, and may denote having a broader directionality within a scope where elements of the present invention operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

Figure 2:
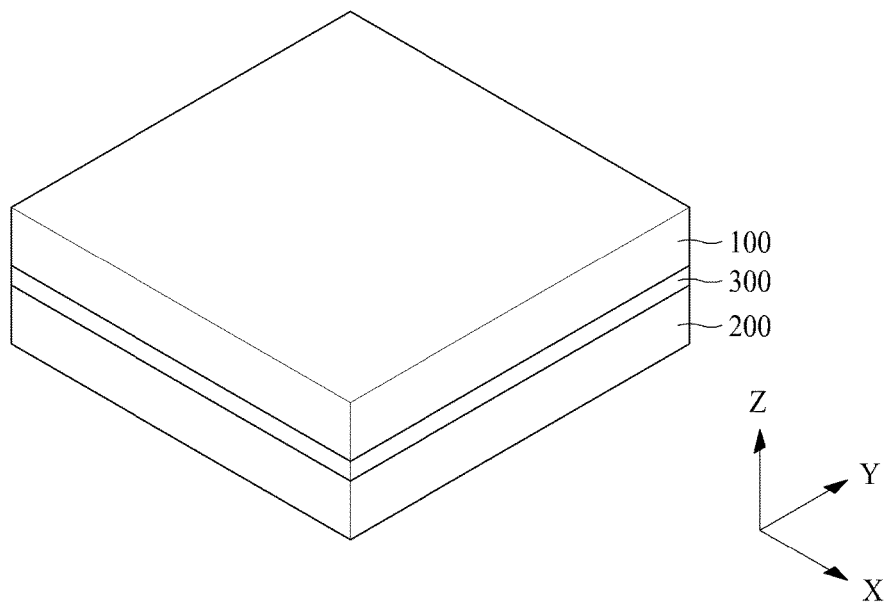
FIG. 2 is a perspective view illustrating a transparent display device according to an embodiment of the present invention.
Figure 3:
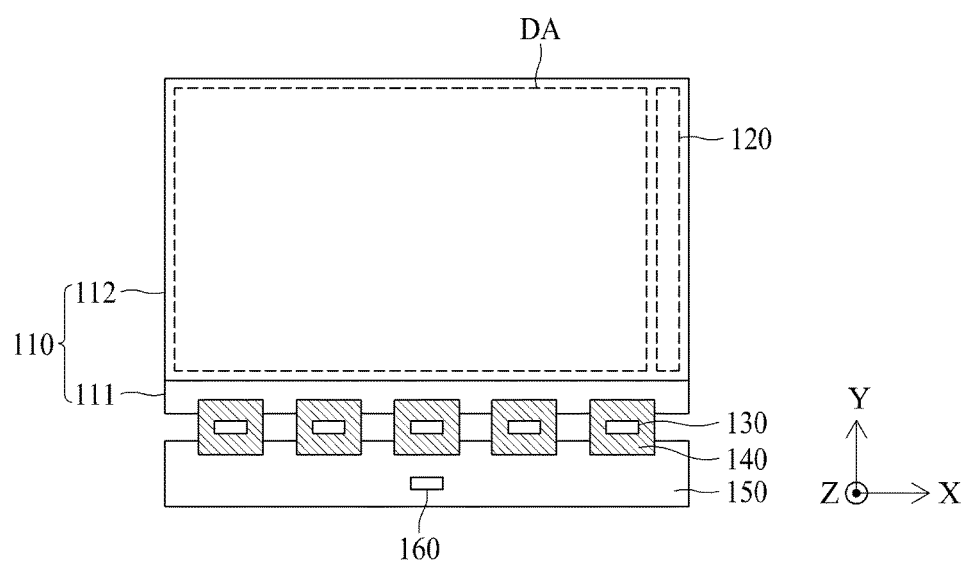
FIG. 3 is a plan view illustrating a transparent display panel, a gate driver, a source drive integrated circuit (IC), a flexible film, a circuit board, and a timing controller included in a transparent display device according to an embodiment of the present invention.
Figure 4:
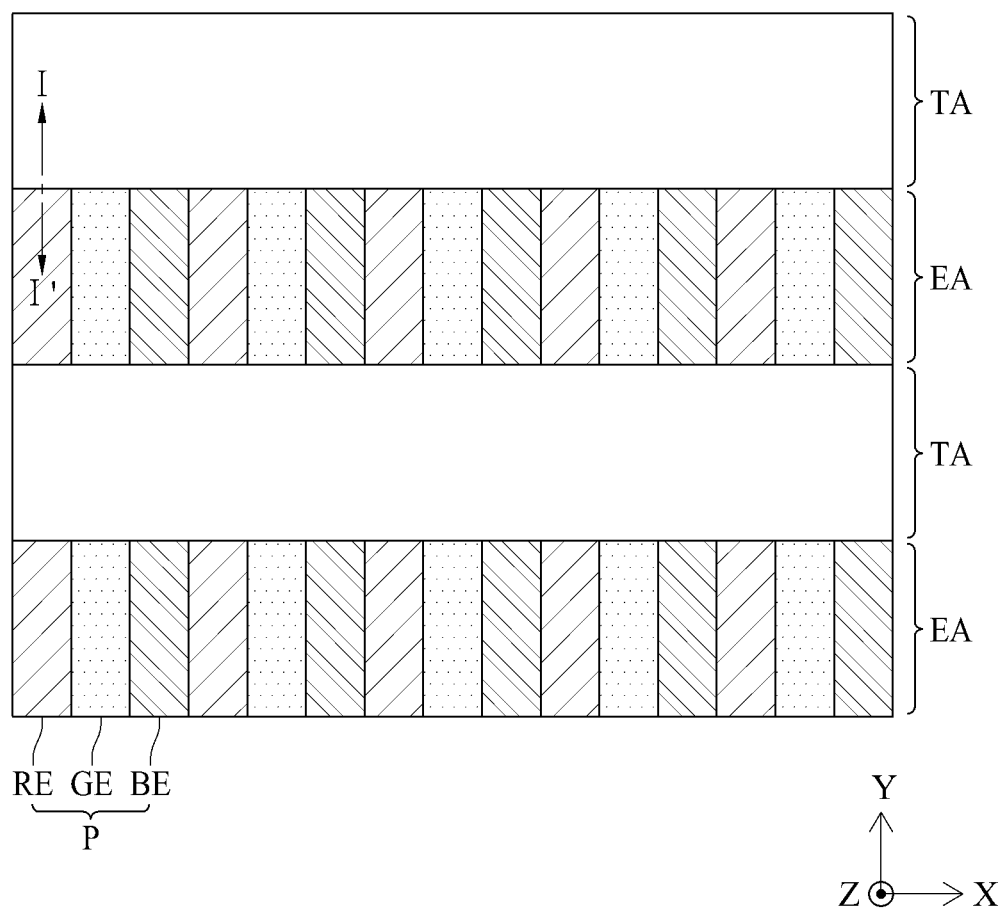
FIG. 4 is an exemplary diagram illustrating a transmissive area and an emissive area included in a display area of FIG. 3.
Figure 5:
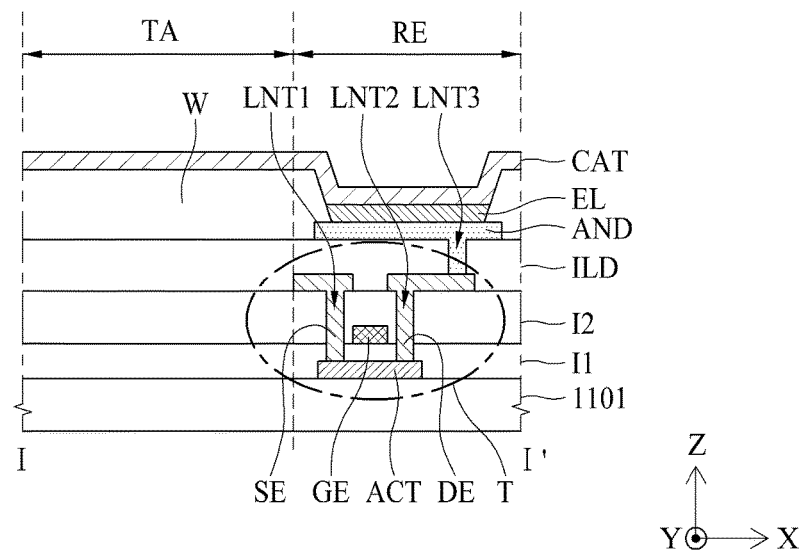
FIG. 5 is a cross-sectional view taken along line I-I' of FIG. 4.
Figure 6:
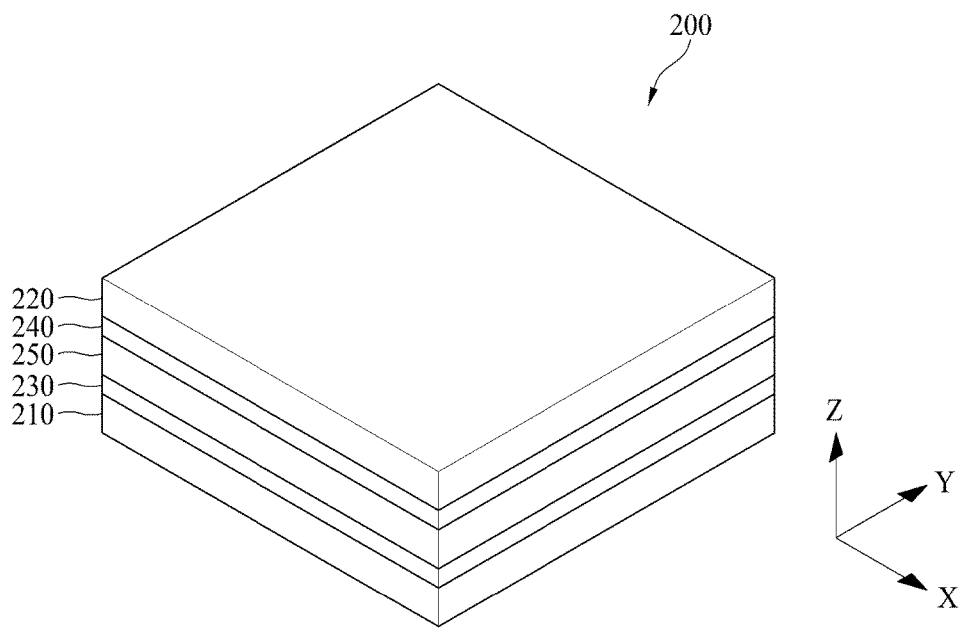
FIG. 6 is a perspective view illustrating in detail a light control device according to an embodiment of the present invention.

FIG. 2 is a perspective view illustrating a transparent display device according to an embodiment of the present invention. FIG. 3 is a plan view illustrating a transparent display panel, a gate driver, a source drive integrated circuit (IC), a flexible film, a circuit board, and a timing controller included in the transparent display device according to an embodiment of the present invention. FIG. 4 is an exemplary diagram illustrating a transmissive area and an emissive area included in a display area of FIG. 3. FIG. 5 is a cross-sectional view taken along line I-I' of FIG. 4. FIG. 6 is a perspective view illustrating in detail a light control device according to an embodiment of the present invention. All the components of the transparent display device and the light control device, according to all embodiments of the present invention are operatively coupled and configured.

Hereinafter, the transparent display device according to an embodiment of the present invention will be described in detail with reference to FIGS. 2 to 6. In FIGS. 2 to 6, for convenience of description, an X-axis direction indicates a direction parallel to a gate line, a Y-axis direction indicates a direction parallel to a data line, and a Z-axis direction indicates a height direction of the transparent display device.

Referring to FIGS. 2 to 6, the transparent display device according to an embodiment of the present invention may include a transparent display panel 100, a gate driver 120, a source drive IC 130, a flexible film 140, a circuit board 150, a timing controller 160, a light control device 200, and an adhesive layer 300.

In the present embodiment, for example, the transparent display device may be implemented as an organic light emitting display device. However, the present embodiment is not limited thereto. In other embodiments, the transparent display device according to an embodiment of the present invention may be implemented as an LCD device, an electrophoresis display device, or the like.

The transparent display panel 100 may include a lower substrate 111 and an upper substrate 112. The upper substrate 112 may be an encapsulation substrate. The lower substrate 111 may be formed larger than the upper substrate 112, and thus, a portion of the lower substrate 111 may be exposed without being covered by the upper substrate 112.

The transparent display panel 100 may transmit incident light or may display an image. A plurality of gate lines and a plurality of data lines may be provided in a display area DA of the transparent display panel 100, and a plurality of pixels P may be respectively provided in intersection areas of the gate lines and the data lines. The pixels P in the display area DA may display an image.

The display area DA may include a transmissive area TA and an emissive area EA as illustrated in FIG. 4. In the transparent display panel 100, the plurality of transmissive areas TA enable a user to look at an object or a background located behind the transparent display panel 100, and the plurality of emissive areas EA may display an image. In FIG. 4, the transmissive area TA and the emissive area EA are illustrated as being long provided in a gate-line direction (an X-axis direction), but is not limited thereto. That is, the transmissive area TA and the emissive area EA may be long provided in a data-line direction (a Y-axis direction).

The transmissive area TA may be an area that transmits incident light almost as-is. The emissive area EA may be an area that emits light. The emissive area EA may include the plurality of pixels P. Each of the pixels P is exemplarily illustrated as including a red emission part RE, a green emission part GE, and a blue emission part BE as in FIG. 4, but is not limited thereto. For example, each of the pixels P may further include a white emission part in addition to the red emission part RE, the green emission part GE, and the blue emission part BE. Alternatively, each of the pixels P may include two or more of a red emission part RE, a green emission part GE, a blue emission part BE, a yellow emission part, a magenta emission part, and a cyan emission part.

The red emission part RE may be an area that emits red light, the green emission part GE may be an area that emits green light, and the blue emission part BE may be an area that emits blue light. The red emission part RE, the green emission part GE, and the blue emission part BE disposed in the emissive area EA may each be a non-transmissive area that emits certain light but does not transmit incident light.

The red emission part RE, the green emission part GE, and the blue emission part BE may each include a transistor T, an anode electrode AND, an organic layer EL, and a cathode electrode CAT as illustrated in FIG. 5.

The transistor T may include an active layer ACT provided on the lower substrate 111, a first insulation layer I1 provided on the active layer ACT, a gate electrode GE provided on the first insulation layer I1, a second insulation layer I2 provided on the gate electrode GE, and a source electrode SE and a drain electrode DE that are provided on the second insulation layer I2 and are respectively connected to the active layer ACT through first and second contact holes CNT1 and CNT2. In FIG. 5, the transistor T is exemplarily illustrated as being formed in a top gate type, but is not limited thereto. In other embodiments, the transistor T may be formed in a bottom gate type.

The anode electrode AND may be connected to the drain electrode DE of the transistor T through a third contact hole CNT3 that passes through an interlayer dielectric ILD provided on the source electrode SE and the drain electrode DE. The anode electrode AND may be provided in plurality. A bank W may be provided between adjacent anode electrodes AND, and thus, the adjacent anode electrodes AND may be electrically insulated from each other.

The organic layer EL may be provided on the anode electrode AND. The organic layer EL may include a hole transporting layer, an organic light emitting layer, and an electron transporting layer. The cathode electrode CAT may be provided on the organic layer EL and the bank W. When a voltage is applied to the cathode electrode CAT and the anode electrode AND, a hole and an electron may respectively move to the organic light emitting layer through the hole transporting layer and the electron transporting layer and may be combined with each other in the organic light emitting layer to emit light.

In FIG. 5, the transparent display panel 100 is exemplarily illustrated as being implemented in a top emission type, but is not limited thereto. In other embodiments, the transparent display panel 100 may be implemented in a bottom emission type. In the top emission type, light emitted from the organic layer EL may be irradiated in a direction toward the upper substrate 112, and thus, the transistor T may be widely provided under the bank W and the anode electrode AND. Therefore, an area occupied by the transistor T may be wider in the top emission type than the bottom emission type. In the top emission type, the anode electrode AND may be formed of a metal material having high reflectivity like aluminum or a stacked structure including aluminum and indium tin oxide (ITO), and the cathode electrode CAT may be formed of a transparent metal material such as ITO, indium zinc oxide (IZO), or the like.

As described above, each of the pixels P of the transparent display device according to an embodiment of the present invention may include the transmissive area TA, which transmits incident light almost as-is, and the emissive area EA that emits light. As a result, in an embodiment of the present invention, a user can look at an object or a background located behind the transparent display device through the transmissive areas TA of the transparent display device.

The gate driver 120 may sequentially supply gate signals to the gate lines according to a gate control signal input from the timing controller 160. In FIG. 3, the gate driver 120 is exemplarily illustrated as being provided outside one side of the display area DA of the transparent display panel 100 in a gate driver-in panel (GIP) type, but is not limited thereto. In other embodiments, the gate driver 120 may be provided outside both sides of the display area DA of the transparent display panel 100 in the GIP type, may be manufactured as a driving chip and may be mounted on a flexible circuit, or may be attached on the transparent display panel 100 in a tape automated bonding (TAB) type.

The source drive IC 130 may receive digital video data and a source control signal from the timing controller 160. The source driver IC 130 may convert the digital video data into analog data voltages according to the source control signal and may respectively supply the analog data voltages to the data lines. If the source drive IC 130 is manufactured as a driving chip, the source drive IC 130 may be mounted on the flexible film 140 in a chip-on film (COF) type or a chip-on plastic (COP) type.

Since a size of the lower substrate 111 is larger than that of the upper substrate 112, a portion of the lower substrate 111 may be exposed without being covered by the upper substrate 112. A plurality of pads such as data pads may be provided in the portion of the lower substrate 111 which is exposed without being covered by the upper substrate 112. Lines connecting the pads to the source drive IC 130 and lines connecting the pads to lines of the circuit board 150 may be provided on the flexible film 140. The flexible film 140 may be attached on the pads by using an anisotropic conductive film, and thus, the pads may be connected to the lines of the flexible film 140.

The circuit board 150 may be attached on the flexible film 140 which is provided in plurality. A plurality of circuits implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board. The timing controller 160 may generate a gate control signal for controlling an operation timing of the gate driver 120 and a source control signal for controlling the source drive IC 130 which is provided in plurality, based on the timing signal. The timing controller 160 may supply the gate control signal to the gate driver 120 and may supply the source control signal to the plurality of source drive ICs 130.

The light control device 200 may block incident light in a light shield mode, and in a transmissive mode, the light control device 200 may transmit the incident light. The light control device 200, as illustrated in FIG. 6, may include a first substrate 210, a second substrate 220, a first electrode 230, a second electrode 240, and a liquid crystal layer 250.

The first and second substrates 210 and 220 may each be a glass substrate or a plastic film. For example, if each of the first and second substrates 210 and 220 is the plastic film, the first and second substrates 210 and 220 may each be a sheet or a film which includes cellulose resin such as triacetyl cellulose (TAC), diacetyl cellulose (DAC), or the like, cyclo olefin polymer (COP) such as norbornene derivatives or the like, acryl resin such as cyclo olefin copolymer (COC), poly(methylmethacrylate) (PMMA), or the like, polyolefin such as polycarbonate (PC), polyethylene (PE), polypropylene (PP), or the like, polyester such as polyvinyl alcohol (PVA), poly ether sulfone (PES), polyetheretherketone (PEEK), polyetherimide (PEI), polyethylenenaphthalate (PEN), polyethyleneterephthalate (PET), or the like, polyimide (PI), polysulfone (PSF), fluoride resin, and/or the like, but is not limited thereto.

The first electrode 230 may be provided on one surface of the first substrate 210 facing the second substrate 220, and the second electrode 240 may be provided on one surface of the second substrate 220 facing the first substrate 210. The first and second electrodes 230 and 240 may each be a transparent electrode.

Each of the first and second electrodes 230 and 240 may be formed of silver oxide (for example, $AgO$, $Ag_2O$, or $Ag_2O_3$), aluminum oxide (for example, $Al_2O_3$), tungsten oxide (for example, $WO_2$, $WO_3$, or $W_2O_3$), magnesium oxide (for example, $MgO$), molybdenum oxide (for example, $MoO_3$), zinc oxide (for example, $ZnO$), tin oxide (for example, $SnO_2$), indium oxide (for example, $In_2O_3$), chromium oxide (for example, $CrO_3$ or $Cr_2O_3$), antimony oxide (for example, $Sb_2O_3$ or $Sb_2O_5$), titanium oxide (for example, $TiO_2$), nickel oxide (for example, $NiO$), copper oxide (for example, $CuO$ or $Cu_2O$), vanadium oxide (for example, $V_2O_3$ or $V_2O_5$), cobalt oxide (for example, $CoO$), iron oxide (for example, $Fe_2O_3$ or $Fe_3O_4$), niobium oxide (for example, $Nb_2O_5$), ITO, IZO, aluminum doped zinc oxide (ZAO), aluminum tin oxide (TAO), or antimony tin oxide (ATO), but is not limited thereto.

The liquid crystal layer 250 may be driven in the transmissive mode, where incident light is transmitted, and the light shield mode where the incident light is blocked. In an embodiment of the present invention, it may be assumed that the light shield mode represents a case where a light transmittance of the light control device 200 is lower than α%, and the transmissive mode represents a case where the light transmittance of the light control device 200 is equal to or higher than β%. The light transmittance of the light control device 200 may represent a ratio of light, which is incident on the light control device 200, to light output from the light control device 200. The light transmittance of the light control device 200 will be described below in detail with reference to FIGS. 9 and 10.

The liquid crystal layer 250 may be a dynamic scattering mode liquid crystal layer which includes liquid crystal, dichroic dyes, and ion materials. In a dynamic scattering mode, when a voltage is applied to the first and second electrodes 230 and 240, the ion materials may allow the liquid crystal and the dichroic dyes to move randomly. In this case, light incident on the liquid crystal layer 250 may be scattered by the randomly moving liquid crystal or may be absorbed by the dichroic dyes, thereby realizing the light shield mode.

Figure 7:
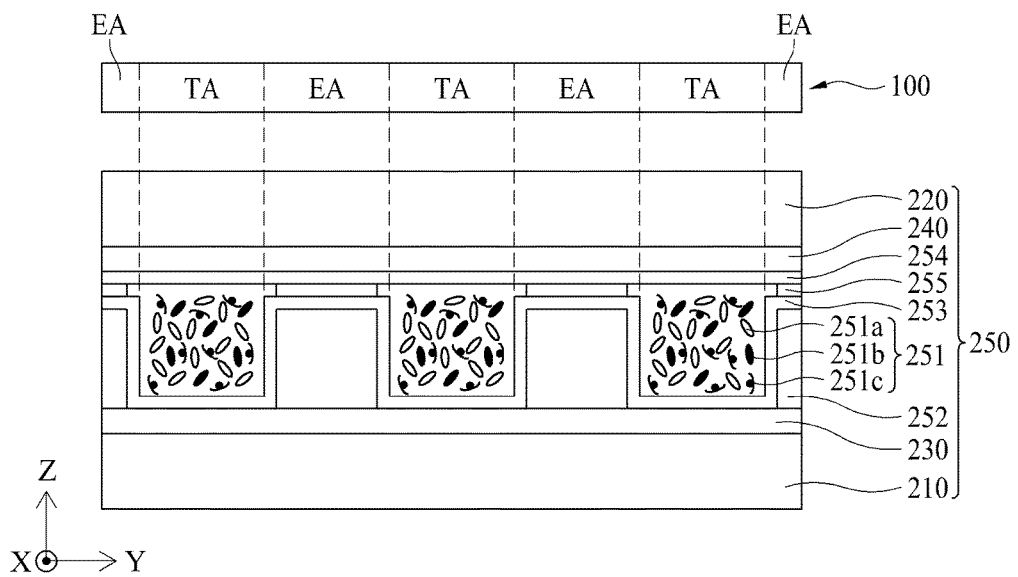
FIG. 7 is a cross-sectional view illustrating an example of one cross-sectional surface of the light control device illustrated in FIG. 6.

In detail, as illustrated in FIG. 7, the liquid crystal layer 250 may include a plurality of liquid crystal cells 251, a plurality of partition walls 252, a first alignment layer 253, a second alignment layer 254, and a plurality of adhesive layers 255.

The liquid crystal cells 251 may each include liquid crystal 251a, dichroic dyes 251b, and ion materials 251c. In the liquid crystal 251a, liquid crystal 251a corresponding to a long-axis direction may be positive liquid crystal which is aligned in a vertical direction (a Z-axis direction) by the first and second alignment layers 253 and 254 even when a voltage is not applied to the first and second electrodes 230 and 240. A long-axis direction of the dichroic dyes 251b, like the liquid crystal 251, may be aligned in a vertical direction (a Z-axis direction) by the first and second alignment layers 253 and 254 even when a voltage is not applied to the first and second electrodes 230 and 240. Therefore, the light control device 200 may operate in the light shield mode even when a voltage is not applied thereto, thereby realizing the transmissive mode without power consumption.

The dichroic dyes 251b may be dyes that absorb light. For example, the dichroic dyes 251b may be black dyes, which absorbs all of light having a visible light wavelength range, or dyes which absorb light outside a wavelength range of a specific color (for example, red) and reflect light having the wavelength range of the specific color (for example, red). In an embodiment of the present invention, an example where the dichroic dyes 251b are black dyes is described, but the present embodiment is limited thereto. For example, the dichroic dyes 251b may be dyes having one of red, green, blue, and yellow or dyes having a color produced by a combination thereof. That is, according to an embodiment of the present invention, in the light shield mode, various colors instead of black-based colors may be expressed, and a background may be blocked. Therefore, according to an embodiment of the present invention, various colors may be provided in the light shield mode, and thus, a user feels a sense of beauty. For example, the transparent display device according to an embodiment of the present invention may be used at public places, and if the transparent display device is applied to a smart window or a public window requiring the transmissive mode and the light shield mode, the transparent display device may block light while expressing various colors.

The ion materials 251c may allow the liquid crystal and the dichroic dyes to move randomly.

The ion materials 251c may have a certain polarity and thus may move to the first electrode 230 or the second electrode 240 according to a polarity of a voltage applied to the first and second electrodes 230 and 240. For example, in a case where the ion materials 251c have a negative polarity, when a voltage having a positive polarity is applied to the first electrode 230 and a voltage having a negative polarity is applied to the second electrode 240, the ion materials 251c may move to the first electrode 230. Also, in a case where the ion materials 251c have a negative polarity, when a voltage having a positive polarity is applied to the second electrode 240 and a voltage having a negative polarity is applied to the first electrode 230, the ion materials 251c may move to the second electrode 240. Also, in a case where the ion materials 251c have a positive polarity, when a voltage having a positive polarity is applied to the first electrode 230 and a voltage having a negative polarity is applied to the second electrode 240, the ion materials 251c may move to the second electrode 240. Also, in a case where the ion materials 251c have a positive polarity, when a voltage having a positive polarity is applied to the second electrode 240 and a voltage having a negative polarity is applied to the first electrode 230, the ion materials 251c may move to the first electrode 230. Therefore, when a voltage is applied to the first and second electrodes 230 and 240, the ion materials 251c may repeat an operation, where the ion materials 251c move from the first electrode 230 to the second electrode 240 and then again move to the first electrode 230, at certain periods. In this case, the ion materials 251c may bump against the liquid crystal 251a and the dichroic dyes 251b while moving, and thus, the liquid crystal 251a and the dichroic dyes 251b may randomly move. Here, the voltage applied to the first and second electrodes 230 and 240 may be an alternating current (AC) voltage.

Alternatively, the ion materials 251c may exchange electrons according to a polarity of a voltage applied to the first and second electrodes 230 and 240. Therefore, when an AC voltage having a certain period is applied to the first and second electrodes 230 and 240, the ion materials 251c may exchange electrons at certain periods. In this case, the ion materials 251c may bump against the liquid crystal 251a and the dichroic dyes 251b while moving, and thus, the liquid crystal 251a and the dichroic dyes 251b may randomly move. Here, the voltage applied to the first and second electrodes 230 and 240 may be an AC voltage.

Since the liquid crystal cells 251 are in a liquid state, the partition walls 252 for maintaining respective cell gaps of the liquid crystal cells 251 may be provided. The partition walls 252 may be arranged on one surface of the first electrode 230 facing the second substrate 220. The partition walls 252 may be spaced apart from each other by a certain interval, and the liquid crystal cells 251 may be divided by the partition walls 252. Due to the partition walls 252, a ratio of the liquid crystal 251a and a ratio of the dichroic dyes 251b may be approximately similarly maintained in each of the liquid crystal cells 251. That is, in an embodiment of the present invention, a ratio of the liquid crystal 251a and a ratio of the dichroic dyes 251b may be equally maintained in the light control device 200. For example, a ratio of the liquid crystal 251a and a ratio of the dichroic dyes 251b may be less than 1% in difference in each of the liquid crystal cells 251. If a ratio of the liquid crystal 251a and a ratio of the dichroic dyes 251b may be more than 1% in difference in each of the liquid crystal cells 251, a difference occurs in a transmittance based on the transmissive mode and a light shield rate based on the light shield mode in each of the liquid crystal cells 251.

The partition walls 252 may each be formed of a transparent material as in FIG. 7. In this case, the partition walls 252 may each be formed of one of photoresist, an ultraviolet (UV) curable polymer, and polydimethylsiloxane, but are not limited thereto.

Alternatively, the partition walls 252 may include a material that absorbs light. For example, each of the partition walls 252 may be implemented as a black partition wall. In this case, since the partition walls 252 absorb light scattered by the liquid crystal 251a in the light shield mode, a light shield rate based on the light shield mode increases. Also, in an embodiment of the present invention, the partition walls 252 may be provided to correspond to the emissive area EA of the transparent display panel 100, and thus, even when each of the partition walls 252 is implemented as the black partition wall, a transmittance is hardly reduced in the transmissive mode.

Alternatively, the partition walls 252 may each include scatter particles 252a that scatter light. The scatter particles 252a may be bids or a silica ball. In this case, the partition walls 252 may again scatter light scattered by the liquid crystal 251a in the light shield mode, and thus, a light path may be long formed. When the light path becomes long, a probability that light is absorbed by the dichroic dyes 251b becomes high, and thus, a light shield rate based on the light shield mode increases.

Moreover, the partition walls 252 cannot actively transmit or block light unlike the liquid crystal 251. That is, if the partition walls 252 are each formed of a transparent material, the partition walls 252 may transmit light but cannot block light. Therefore, in a case where the partition walls 252 are formed in an area corresponding to the transmissive area TA of the transparent display device, since light leakage occurs in the partition walls 252 in the light shield mode, a light transmittance becomes high, or since the partition walls 252 block light in the transmissive mode, a light transmittance is lowered. Accordingly, the partition walls 252 may be disposed in correspondence with the emissive areas EA of the transparent display panel 100 as illustrated in FIG. 7, and the liquid crystal cells 251 may be disposed in correspondence with the transmissive areas TA of the transparent display panel 100. The partition walls 252 may be arranged in a stripe type, but are not limited thereto. In other embodiments, the partition walls 252 may be arranged in a honeycomb type or a p-angular (where p is a positive integer equal to or more than three) type.

The first alignment layer 253 may be provided on the partition walls 252 and one surface of the first electrode 230 facing the second substrate 220. The second alignment layer 254 may be provided on one surface of the second electrode 240 facing the first substrate 210. Each of the first and second alignment layers 253 and 254 may be a vertical alignment layer that allows a long-axis direction of each of the liquid crystal 251a and the dichroic dyes 251b to be aligned in the vertical direction (the Z-axis direction) when a voltage is not applied to the first and second electrodes 230 and 240.

Figure 8:
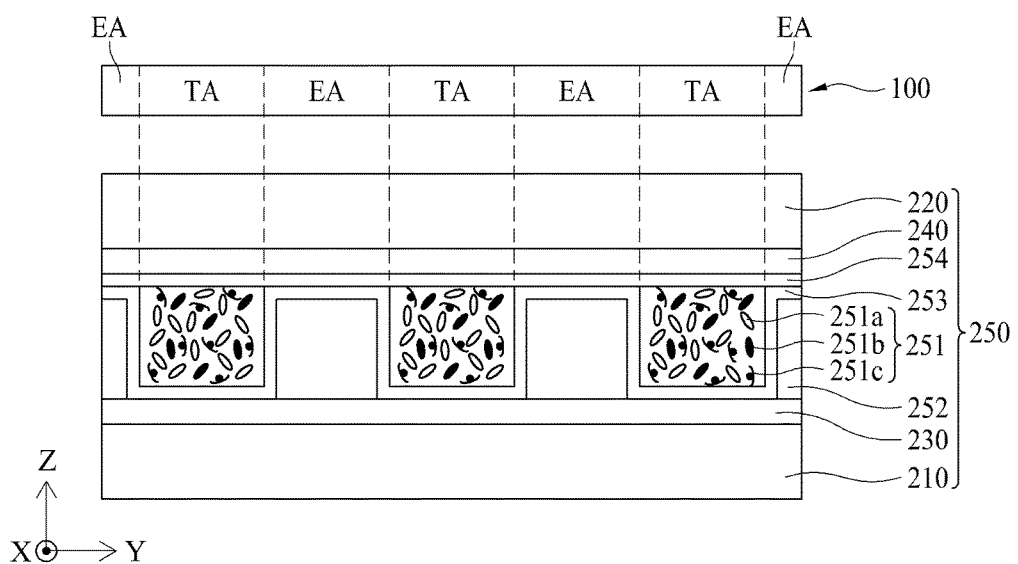
FIG. 8 is a cross-sectional view illustrating another example of one cross-sectional surface of the light control device illustrated in FIG. 6.

The adhesive layers 255 may be disposed on the first alignment 253 disposed on the partition walls 252. Therefore, the first alignment layers 253 and 254 disposed on the partition walls 252 may be adhered to each other by the adhesive layers 255. In FIGS. 6 to 8, the adhesive layers 255 are illustrated as being disposed on only the first alignment layer 253 disposed on the partition walls 252, but may be disposed on the liquid crystal cells 251 as well as the partition walls 252.

Figure 13:
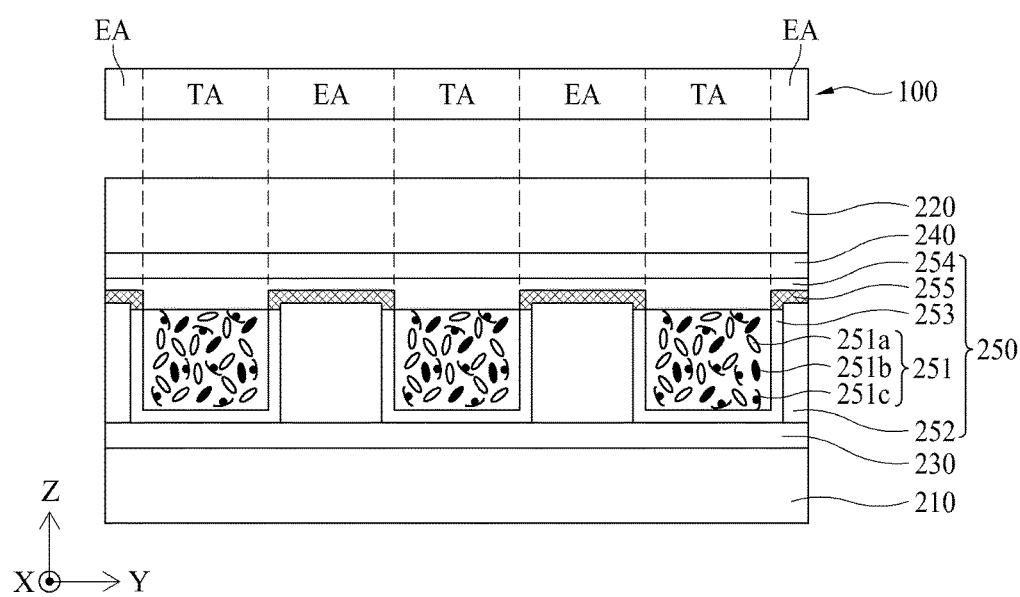
FIG. 13 is a cross-sectional view illustrating another example of one cross-sectional surface of the light control device illustrated in FIG. 6.

Alternatively, the second alignment layer 254 may include an adhesive material as shown in FIG. 13. In this case, as illustrated in FIG. 8, the second alignment layer 254 may be adhered to the first alignment layer 253 even without the adhesive layers 255, and thus, the adhesive layers 255 may be omitted.

In this case, as an area of each of the partition walls 252 becomes wide, an adhesion area of the first alignment layer 253 and the second alignment layer 254 becomes wide, and thus, an adhesive force between the first alignment layer 253 and the second alignment layer 254 increases. If each of the first substrate 210 and the second substrate 220 is a plastic film, it is difficult to bond the first substrate 210 and the second substrate 220 by using a separate adhesive, and thus, the adhesion area of the first alignment layer 253 and the second alignment layer 254 may be widened for increasing the adhesive force between the first alignment layer 253 and the second alignment layer 254. However, since an area of each of the liquid crystal cells 251 is narrowed as the area of each of the partition walls 252 is widened, a light shield rate based on the light shield mode is lowered. Accordingly, the area of each of the partition walls 252 may be appropriately adjusted based on the adhesive force between the first alignment layer 253 and the second alignment layer 254 and the light shield rate based on the light shield mode.

The transparent display panel 100 may be adhered to the light control device 200 by the adhesive layer 300. The adhesive layer 300 may be a transparent adhesive film such as an optically clear adhesive (OCA) or a transparent adhesive such as an optically clear resin (OCR).

As described above, the light control device 200 according to an embodiment of the present invention may not apply a voltage to the first and second electrodes 230 and 240 in the transmissive mode, and thus, a long-axis direction of each of the liquid crystal 251a and the dichroic dyes 251b may be aligned in the vertical direction (the Z-axis direction) by the first and second alignment layers 253 and 254. Therefore, the liquid crystal 251a and the dichroic dyes 251b may be aligned in a direction in which light is incident, and thus, the incidences of scattering and absorption of light by the liquid crystal 251a and the dichroic dyes 251b are minimized. Accordingly, most of light incident on the light control device 200 may pass through the liquid crystal cells 251.

Moreover, the light control device 200 according to an embodiment of the present invention may apply a voltage to the first and second electrodes 230 and 240 in the light shield mode, and in this case, the liquid crystal 251a and the dichroic dyes 251b may be randomly moved by the ion materials 251c. As a result, the light may be scattered by the liquid crystal 251a of the liquid crystal cells 251 or may be absorbed by the dichroic dyes 251b, and thus, most of the light incident on the light control device 200 may be blocked by the liquid crystal cells 251.

Figure 1B:
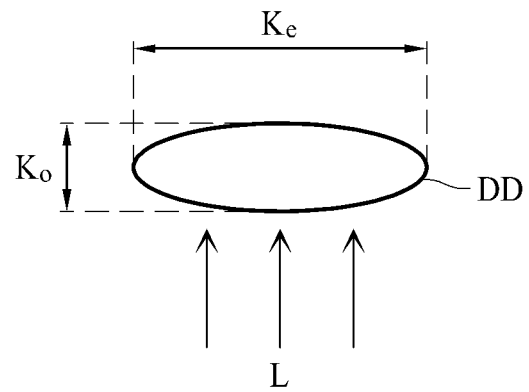

Furthermore, in an embodiment of the present invention, since the liquid crystal layer 250 does not include a polymer, a UV curing process of curing a polymer is not performed in manufacturing the light control device 200. As a result, in an embodiment of the present invention, a problem where a dichroic ratio (DR) of dichroic dyes is lowered because the dichroic dyes are discolored by UV is prevented. The DR may be defined as a long-axis direction absorption ratio of dichroic dyes or a short-axis direction absorption ratio of dichroic dyes. The long-axis direction absorption ratio of dichroic dyes denotes an absorption ratio of light L when dichroic dyes DD are aligned in a long-axis direction Ke as illustrated in FIG. 1A, and the short-axis direction absorption ratio of dichroic dyes denotes an absorption ratio of the light L when the dichroic dyes DD are aligned in a short-axis direction Ko as illustrated in FIG. 1B. Accordingly, in an embodiment of the present invention, a light transmittance based on the light shield mode is further lowered than a case where the light control device is applied to polymer-dispersed LCD devices including liquid crystal and dichroic dyes.

Figure 9:
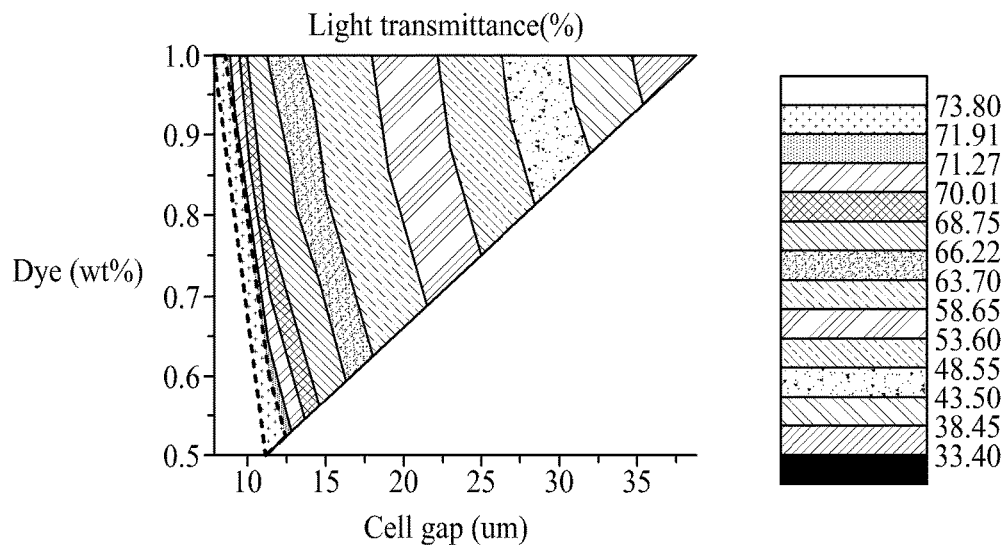
FIG. 9 is a graph showing a light transmittance in a transmissive mode of a light control device according to an embodiment of the present invention.
Figure 10:
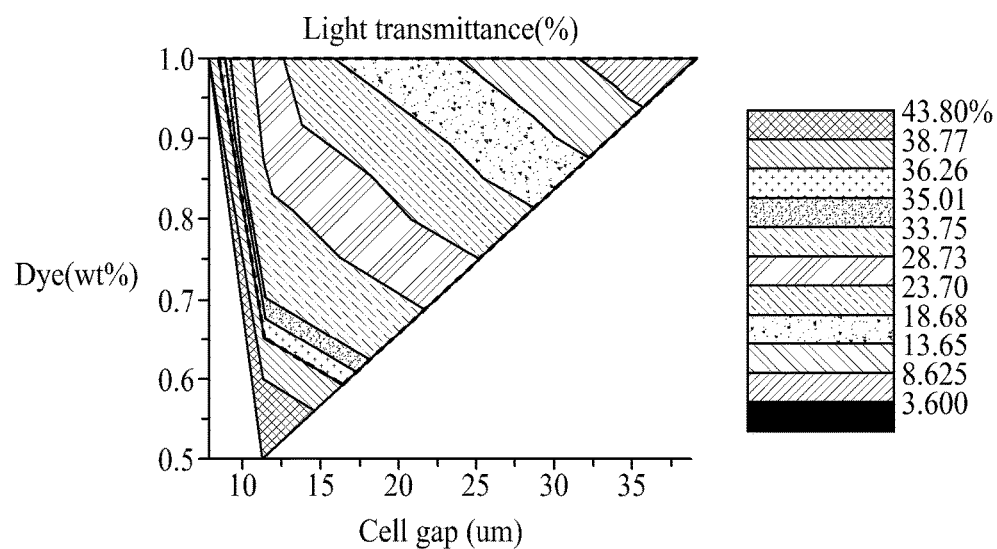
FIG. 10 is a graph showing a light transmittance in a light shield mode of a light control device according to an embodiment of the present invention.

FIG. 9 is a graph showing a light transmittance in a transmissive mode of a light control device according to an embodiment of the present invention. FIG. 10 is a graph showing a light transmittance in a light shield mode of a light control device according to an embodiment of the present invention. In FIGS. 9 and 10, the X axis indicates a cell gap (μm) of each of the liquid crystal cells 251, and the Y axis indicates a weight (wt %) of the dichroic dyes 251b included in each of the liquid crystal cells 251. Hereinafter, the cell gap (μm) of each of the liquid crystal cells 251 and the weight (wt %) of the dichroic dyes 251b included in each of the liquid crystal cells 251 for controlling a light transmittance to α% or less in the light shield mode of the light control device 200 and controlling the light transmittance to β% or more in the transmissive mode will be described with reference to FIGS. 9 and 10. In FIGS. 9 and 10, for convenience of description, α% is set to 35%, and β% is set to 72%.

In FIG. 9, a range where the light transmittance satisfies 72% or more in the transmissive mode is illustrated as a dotted line. The range where the light transmittance satisfies 72% or more in the transmissive mode corresponds to a case where the cell gap (μm) of each of the liquid crystal cells 251 is equal to or less than about 12.5 μm and the weight (wt %) of the dichroic dyes 251b included in each of the liquid crystal cells 251 is 0.5 wt % to 1.0 wt %.

In FIG. 10, a range where the light transmittance satisfies 35% or less in the light shield mode is illustrated as a dotted line. The range where the light transmittance satisfies 35% or less in the light shield mode corresponds to a case where the cell gap (μm) of each of the liquid crystal cells 251 is about 3 μm to 37 μm and the weight (wt %) of the dichroic dyes 251b included in each of the liquid crystal cells 251 is 0.6 wt % to 1.0 wt %.

In an embodiment of the present invention, a case where the light transmittance is 72% or more in the transmissive mode and a case where the light transmittance is 35% or less in the light shield mode should be satisfied. Therefore, a range which satisfies two the cases corresponds to a case where the cell gap (μm) of each of the liquid crystal cells 251 is about 3 μm to 12.5 μm and the weight (wt %) of the dichroic dyes 251b included in each of the liquid crystal cells 251 is 0.6 wt % to 0.9 wt %. If the cell gap (μm) of each of the liquid crystal cells 251 and the weight (wt %) of the dichroic dyes 251b included in each of the liquid crystal cells 251 differ from the numerical values, the light transmittance becomes lower than 72% in the transmissive mode or becomes higher than 35% in the light shield mode, and for this reason, a normal transmissive mode or a normal light shield mode cannot be realized.

Figure 11:
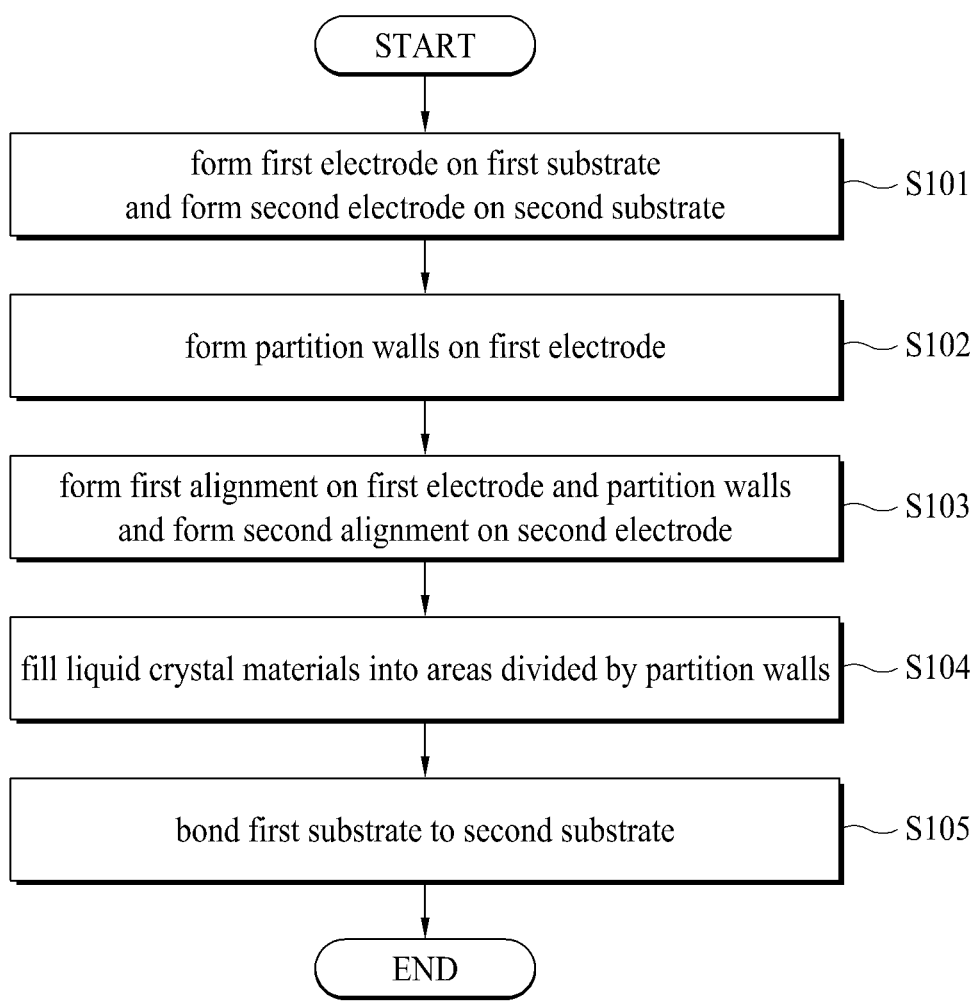
FIG. 11 is a flowchart illustrating a method of manufacturing a light control device according to an embodiment of the present invention.

FIG. 11 is a flowchart illustrating a method of manufacturing a light control device according to an embodiment of the present invention. FIGS. 12A to 12E are cross-sectional views for describing the method of manufacturing the light control device according to an embodiment of the present invention. Hereinafter, the method of manufacturing the light control device according to an embodiment of the present invention will be described in detail with reference to FIGS. 11 and 12A to 12E.

Figure 12A:
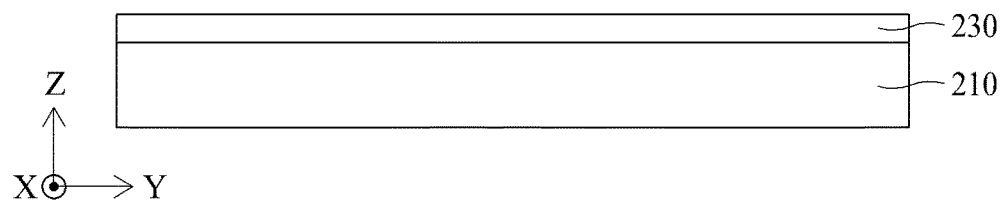
FIGS. 12A to 12E are cross-sectional views for describing a method of manufacturing a light control device according to an embodiment of the present invention.
Figure 12B:
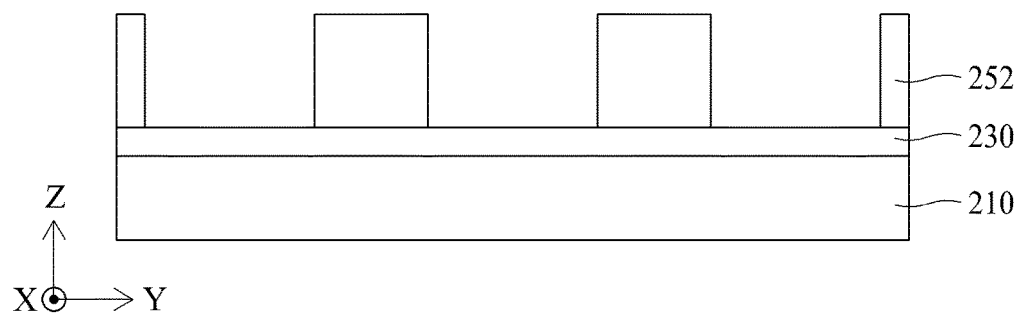
Figure 12C:
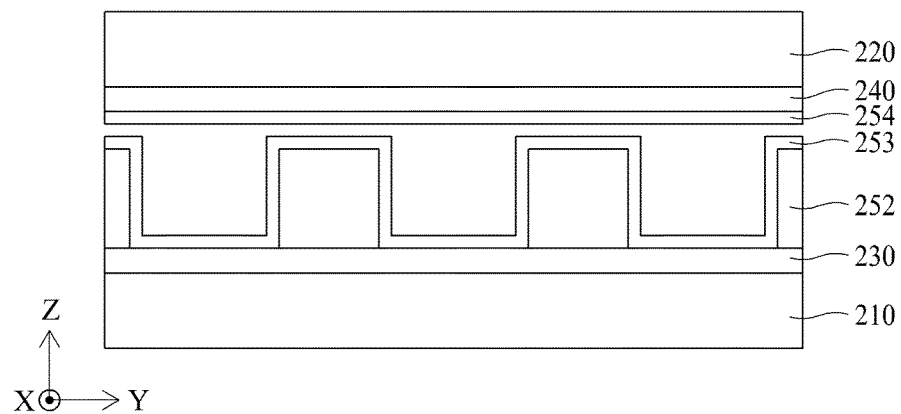
Figure 12D:
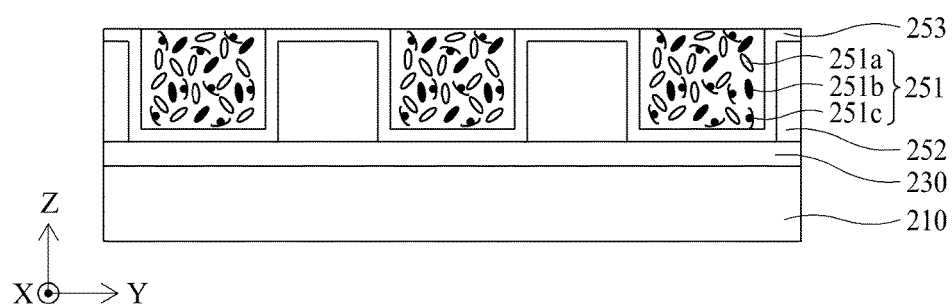

First, as illustrated in FIG. 12A, the first electrode 230 may be formed on one surface of the first substrate 210 facing the second substrate 220, and the second electrode 240 may be formed on one surface of the second substrate 220 facing the first substrate 210.

The first and second substrates 210 and 220 may each be a glass substrate or a plastic film. For example, if each of the first and second substrates 210 and 220 is the plastic film, the first and second substrates 210 and 220 may each be a sheet or a film which includes cellulose resin such as triacetyl cellulose (TAC), diacetyl cellulose (DAC), or the like, cyclo olefin polymer (COP) such as norbornene derivatives or the like, acryl resin such as cyclo olefin copolymer (COC), poly(methylmethacrylate) (PMMA), or the like, polyolefin such as polycarbonate (PC), polyethylene (PE), polypropylene (PP), or the like, polyester such as polyvinyl alcohol (PVA), poly ether sulfone (PES), polyetheretherketone (PEEK), polyetherimide (PEI), polyethylenenaphthalate (PEN), polyethyleneterephthalate (PET), or the like, polyimide (PI), polysulfone (PSF), fluoride resin, and/or the like, but is not limited thereto.

Each of the first and second electrodes 230 and 240 may be formed of silver oxide (for example, AgO, Ag$_2$O, or Ag$_2$O$_3$), aluminum oxide (for example, Al$_2$O$_3$), tungsten oxide (for example, WO$_2$, WO$_3$, or W$_2$O$_3$), magnesium oxide (for example, MgO), molybdenum oxide (for example, MoO$_3$), zinc oxide (for example, ZnO), tin oxide (for example, SnO$_2$), indium oxide (for example, In$_2$O$_3$), chromium oxide (for example, CrO$_3$ or Cr$_2$O$_3$), antimony oxide (for example, Sb$_2$O$_3$ or Sb$_2$O$_5$), titanium oxide (for example, TiO$_2$), nickel oxide (for example, NiO), copper oxide (for example, CuO or Cu$_2$O), vanadium oxide (for example, V$_2$O$_3$ or V$_2$O$_5$), cobalt oxide (for example, CoO), iron oxide (for example, Fe$_2$O$_3$ or Fe$_3$O$_4$), niobium oxide (for example, Nb$_2$O$_5$), ITO, IZO, aluminum doped zinc oxide (ZAO), aluminum tin oxide (TAO), or antimony tin oxide (ATO), but is not limited thereto. (S101 of FIG. 11)

Second, the partition walls 252 may be formed on one surface of the first electrode 230 facing the second substrate 220. The partition walls 252 may be formed by an imprinting process or a photolithography process.

In a case where the partition walls 252 are formed by the imprinting process, a material included in each of the partition walls 252 may be coated on the one surface of the first electrode 230 facing the second substrate 220, and then, a mold including silicon, quartz, or a polymer material may pressurize the coated material, thereby forming the partition walls 252. The mold may include a pattern of the partition walls 252 where a height and a width of each of the partition walls 252 are designed. For example, the partition walls 252 may maintain the cell gaps of the liquid crystal cells 251, and as illustrated in FIGS. 9 and 10, the cell gaps of the liquid crystal cells 251 may each be adjusted to about 3 μm to 12.5 μm, whereby the height of each of the partition walls 252 may be adjusted to about 3 μm to 12.5 μm. Also, the partition walls 252 may be disposed in correspondence with the emissive areas EA of the transparent display panel 100, and thus, the width of each of the partition walls 252 may be adjusted to a width of each of the emissive areas EA or less.

In a case where the partition walls 252 are formed by the photolithography process, a material included in each of the partition walls 252 may be coated on the one surface of the first electrode 230 facing the second substrate 220, and then, by exposing the coated material through a photo process, the partition walls 252 may be formed.

In a case where the partition walls 252 are formed of a transparent material, the partition walls 252 may each be formed of one of photoresist, a UV curable polymer, and polydimethylsiloxane. Alternatively, the partition walls 252 may each include a material that absorbs light. For example, each of the partition walls 252 may be implemented as a black partition wall. Alternatively, the partition walls 252 may each include a scatter particle that scatters light. The scatter particle may be bids or a silica ball.

Also, the partition walls 252 may be disposed in correspondence with the emissive areas EA of the transparent display panel 100 as illustrated in FIG. 7, and the liquid crystal cells 251 may be disposed in correspondence with the transmissive areas TA of the transparent display panel 100. (S102 of FIG. 11)

Third, the first alignment layer 253 may be formed on the partition walls 252 and the one surface of the first electrode 230 facing the second substrate 220. The second alignment layer 254 may be formed on one surface of the second electrode 240 facing the first substrate 210. Each of the first and second alignment layers 253 and 254 may be a vertical alignment layer that allows a long-axis direction of each of the liquid crystal 251a and the dichroic dyes 251b to be aligned in the vertical direction (the Z-axis direction) when a voltage is not applied to the first and second electrodes 230 and 240. (S103 of FIG. 11)

Forth, areas divided by the partition walls 252 may be filled with liquid crystal materials, thereby forming the liquid crystal cells 251. The areas divided by the partition walls 252 may be filled with the liquid crystal materials through an inkjet process.

The liquid crystal materials may include the liquid crystal 251a, the dichroic dyes 251b, and the ion materials 251c. In an embodiment of the present invention, as shown in FIGS. 9 and 10, in order to satisfy a case where the light transmittance is 72% or more in the transmissive mode and a case where the light transmittance is 35% or less in the light shield mode, the cell gap (μm) of each of the liquid crystal cells 251 may be adjusted to about 3 μm to 12.5 μm, and the dichroic dyes 251b may be added into each of the liquid crystal cells 251 by 0.6 wt % to 0.9 wt %. (S104 of FIG. 11)

Figure 12E:
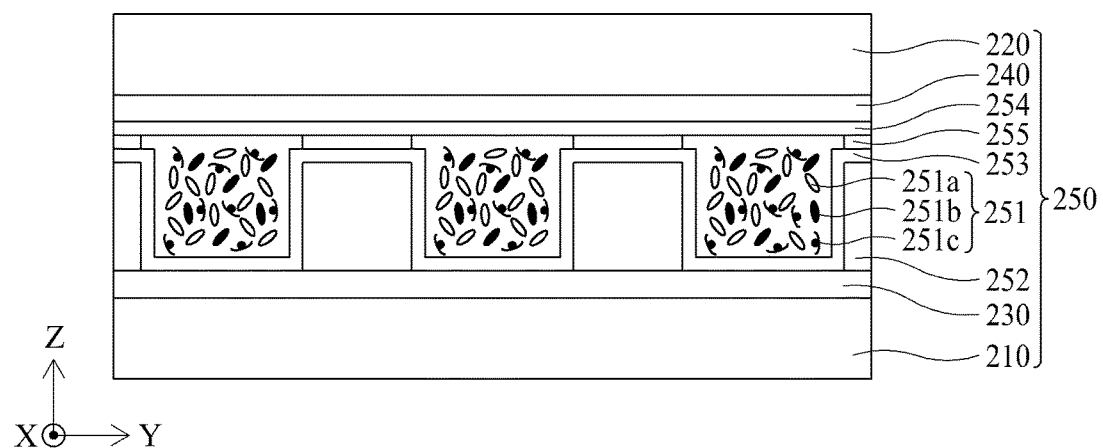

Fifth, as illustrated in FIG. 12E, by attaching the first alignment layer 253 on the second alignment layer 254, the first substrate 210 may be bonded to the second substrate 220. The first alignment layer 253 may be attached on the second alignment layer 254 by the adhesive layers 255. The adhesive layers 255 may be disposed on the first alignment layer 253 disposed on the partition walls 252, and in this case, the adhesive layers 255 may attach the first alignment layer 253 and the second alignment layer 254 which are disposed on the partition walls 252. Alternatively, the adhesive layers 255 may be disposed on the one surface of the second electrode 240 facing the first substrate 210, and in this case, the adhesive layers 255 may be disposed on the liquid crystal cells 251 as well as the partition walls 252.

Alternatively, the second alignment layer 254 may include an adhesive material. In this case, as illustrated in FIG. 8, the second alignment layer 254 may be adhered to the first alignment layer 253 even without the adhesive layers 255, and thus, the adhesive layers 255 may be omitted. The adhesive material included in the second alignment layer 254 may be a silane coupling agent. (S105 of FIG. 14)

As describe above, in an embodiment of the present invention, since the liquid crystal layer 250 does not include a polymer, a UV curing process of curing a polymer is not performed in manufacturing the light control device 200. As a result, in an embodiment of the present invention, a problem where a dichroic ratio (DR) of dichroic dyes is lowered because the dichroic dyes are discolored by UV is prevented. The DR may be defined as a long-axis direction absorption ratio of dichroic dyes or a short-axis direction absorption ratio of dichroic dyes. The long-axis direction absorption ratio of dichroic dyes denotes an absorption ratio of light L when dichroic dyes DD are aligned in a long-axis direction Ke as illustrated in FIG. 1A, and the short-axis direction absorption ratio of dichroic dyes denotes an absorption ratio of the light L when the dichroic dyes DD are aligned in a short-axis direction Ko as illustrated in FIG. 1B. Accordingly, in an embodiment of the present invention, a light transmittance based on the light shield mode is further lowered than a case where the light control device is applied to polymer-dispersed LCD devices including liquid crystal and dichroic dyes.

FIG. 13 is a cross-sectional view illustrating another example of one cross-sectional surface of the light control device illustrated in FIG. 6. Referring to FIG. 13, a light control device 200 according to another embodiment of the present invention may include a first substrate 210, a second substrate 220, a first electrode 230, a second electrode 240, and a liquid crystal layer 250. The first substrate 210, the second substrate 220, the first electrode 230, and the second electrode 240 of FIG. 13 are substantially the same as the first substrate 210, the second substrate 220, the first electrode 230, and the second electrode 240 described above with reference to FIGS. 6 and 7, and thus, their detailed descriptions are omitted.

The liquid crystal layer 250, as in FIG. 13, may include a plurality of liquid crystal cells 251, a plurality of partition walls 252, a first alignment layer 253, and a second alignment layer 254. The liquid crystal cells 251 of FIG. 13 are substantially the same as the liquid crystal cells 251 described above with reference to FIGS. 6 and 7, and thus, their detailed descriptions are omitted. Hereinafter, the partition walls 252, the first alignment layer 253, and the second alignment layer 254 of the liquid crystal layer 250 will be described in detail.

The second alignment layer 254 may be adhered to an upper portion of each of the partition walls 252. In this case, the upper portion of each of the partition walls 252 may be partially inserted into the second alignment layer 254. That is, the upper portion of each of the partition walls 252 may be inserted into the second alignment layer 254 and then may be cured, and thus, the second alignment layer 254 may be adhered to each of the partition walls 252. Therefore, an adhesive area 255 may be provided between the partition walls 252 and the second alignment layer 254. In this case, the first alignment layer 253 remaining on each of the partition walls 252 may be disposed in the adhesive area 255.

The partition walls 252 are for maintaining a cell gap of the liquid crystal layer 250. Due to the partition walls 252, the inside of the liquid crystal layer 250 is protected from a force applied from the outside.

The partition walls 252 may each be formed of a transparent material. In this case, the partition walls 252 may each be formed of one of photoresist, an ultraviolet (UV) curable polymer, and polydimethylsiloxane, but are not limited thereto.

Alternatively, the partition walls 252 may include a material that absorbs light. For example, each of the partition walls 252 may be implemented as a black partition wall. In this case, since the partition walls 252 absorb light scattered by a liquid crystal 251a in the light shield mode, a light shield rate based on the light shield mode increases. Also, in an embodiment of the present invention, the partition walls 252 may be provided to correspond to an emissive area EA of the transparent display panel 100, and thus, even when each of the partition walls 252 is implemented as the black partition wall, a transmittance is hardly reduced in the transmissive mode.

Alternatively, the partition walls 252 may each include scatter particles 252a that scatter light. The scatter particles 252a may be bids or a silica ball. In this case, the partition walls 252 may again scatter light scattered by the liquid crystal 251a in the light shield mode, and thus, a light path may be long formed. When the light path becomes long, a probability that light is absorbed by dichroic dyes 251b becomes high, and thus, a light shield rate based on the light shield mode increases.

Moreover, the partition walls 252 cannot actively transmit or block light unlike the liquid crystal 251. That is, if the partition walls 252 are each formed of a transparent material, the partition walls 252 may transmit light but cannot block light. Therefore, in a case where the partition walls 252 are formed in an area corresponding to the transmissive area TA of the transparent display device, since light leakage occurs in the partition walls 252 in the light shield mode, a light transmittance becomes high, or since the partition walls 252 block light in the transmissive mode, a light transmittance is lowered. Accordingly, the partition walls 252 may be disposed in correspondence with the emissive areas EA of the transparent display panel 100 as illustrated in FIG. 6, and the liquid crystal cells 251 may be disposed in correspondence with the transmissive areas TA of the transparent display panel 100. The partition walls 252 may be arranged in a stripe type, but are not limited thereto. In other embodiments, the partition walls 252 may be arranged in a honeycomb type or a p-angular (where p is a positive integer equal to or more than three) type.

The first alignment layer 253 may be provided on the partition walls 252 and the first electrode 230 facing the second substrate 220. The first alignment layer 253 may be thinly formed to a thickness of several hundreds Å, for example, a thickness of 200 Å or less. Therefore, the first alignment layer 253 having a thin thickness may be provided on a top of each of the partition walls 252, but is not limited thereto. In other embodiments, depending on a process differential, the first alignment layer 253 may not be provided in a portion of the top of each of the partition walls 252. Also, a portion of the first alignment layer 253 provided on the partition walls 252 may be separated from the partition walls 252 in a process of inserting the partition walls 252 into the second alignment layer 254. Therefore, the adhesive area 255 may be a portion where the partition walls 252 and the first and second alignment layers 253 and 254 remaining on each of the partition walls 252 are physical coupled to each other. For example, polyimide (PI) may be used as the first alignment layer 253, but is not limited thereto.

The second alignment layer 254 may be provided on one surface of the second electrode 240 facing the first substrate 210. The partition walls 252 may be inserted into the second alignment layer 254. In this case, the first alignment layer 253 provided on the partition walls 252 may also be inserted into the second alignment layer 254. Therefore, a thickness of the second alignment layer 254 may be thicker than that of the first alignment layer 253. The partition walls 252 may be inserted into the second alignment layer 254 and then may be cured, and thus, the adhesive area 255 may be provided between the second alignment layer 254 and the partition walls 252. The adhesive area 255 may include the partition walls 252 and the first and second alignment layers 253 and 254 remaining on each of the partition walls 252.

The second alignment layer 254 may be polyimide (PI) including an adhesive material. Here, the adhesive material may use epoxy resin, polyolefin resin, or acrylic resin, but is not limited thereto. Alternatively, the adhesive material may be a silane coupling agent. Since the second alignment layer 254 includes the adhesive material, a top of each of the partition walls 252 may be adhered to the second alignment layer 254.

Hydrophobic processing may be performed on one surface of the second alignment layer 254. Here, the one surface of the second alignment layer 254 may be defined as a surface facing the first substrate. Since the second alignment layer 254 includes the adhesive material, the liquid crystal cells 251 provided between the second alignment layer 254 and the first alignment layer 253 may be adhered to the one surface of the second alignment layer 254. However, in the present embodiment, since the hydrophobic processing is performed on the one surface of the second alignment layer 254, the liquid crystal cells 251 are not adhered to the second alignment layer 254.

A thickness of the second alignment layer 254 may be thickly adjusted for increasing an adhesive force. However, if the thickness of the second alignment layer 254 is thickened, a voltage applied to the second electrode 240 should increase for normally applying a vertical electric field to the liquid crystal layer 250. In the present embodiment, in order to lower the voltage applied to the second electrode 240, the second alignment layer 254 may include nano particles which are high in dielectric constant. The nano particles may use silica nano particles, ITO nano particles, titanium oxide nano particles ($TiO_2$ nano particles), and/or the like. If the second alignment layer 254 includes the nano particles, a dielectric constant of the alignment layer 254 increases, and thus, the vertical electric field is normally applied to the liquid crystal layer 250 without increasing the voltage applied to the second electrode 240.

Each of the first and second alignment layers 253 and 254 may be a vertical alignment layer that allows a long-axis direction of each of the liquid crystal 251a and the dichroic dyes 251b to be aligned in a vertical direction (a Z-axis direction) when a voltage is not applied to the first and second electrodes 230 and 240.

As an area of each of the partition walls 252 becomes wide, an adhesion area of the partition walls 252 and the second alignment layer 254 becomes wide, and thus, an adhesive force between the partition walls 252 and the second alignment layer 254 increases. If each of the first substrate 210 and the second substrate 220 is a plastic film, it is difficult to bond the first substrate 210 and the second substrate 220 by using a separate adhesive, and thus, the adhesion area of the partition walls 252 and the second alignment layer 254 may be widened for increasing the adhesive force between the partition walls 252 and the second alignment layer 254. However, since an area of each of the liquid crystal cells 251 is narrowed as the area of each of the partition walls 252 is widened, a light shield rate based on the light shield mode is lowered. Accordingly, the area of each of the partition walls 252 may be appropriately adjusted based on the adhesive force between the partition walls 252 and the second alignment layer 254 and the light shield rate based on the light shield mode.

According to the present embodiment, since each of the partition walls 252 is inserted into the second alignment layer 254 including the adhesive material and then is adhered, an adhesive force between the second alignment layer 254 and the partition walls 252 increases. Therefore, the first substrate 210 and the second substrate 220 are not separated from each other by an external impact in bonding the first substrate 210 to the second substrate 220. Also, the liquid crystal cells 251 may be moved by external pressure, thereby solving a problem where a light transmittance is reduced in the transmissive mode.

Figure 14:
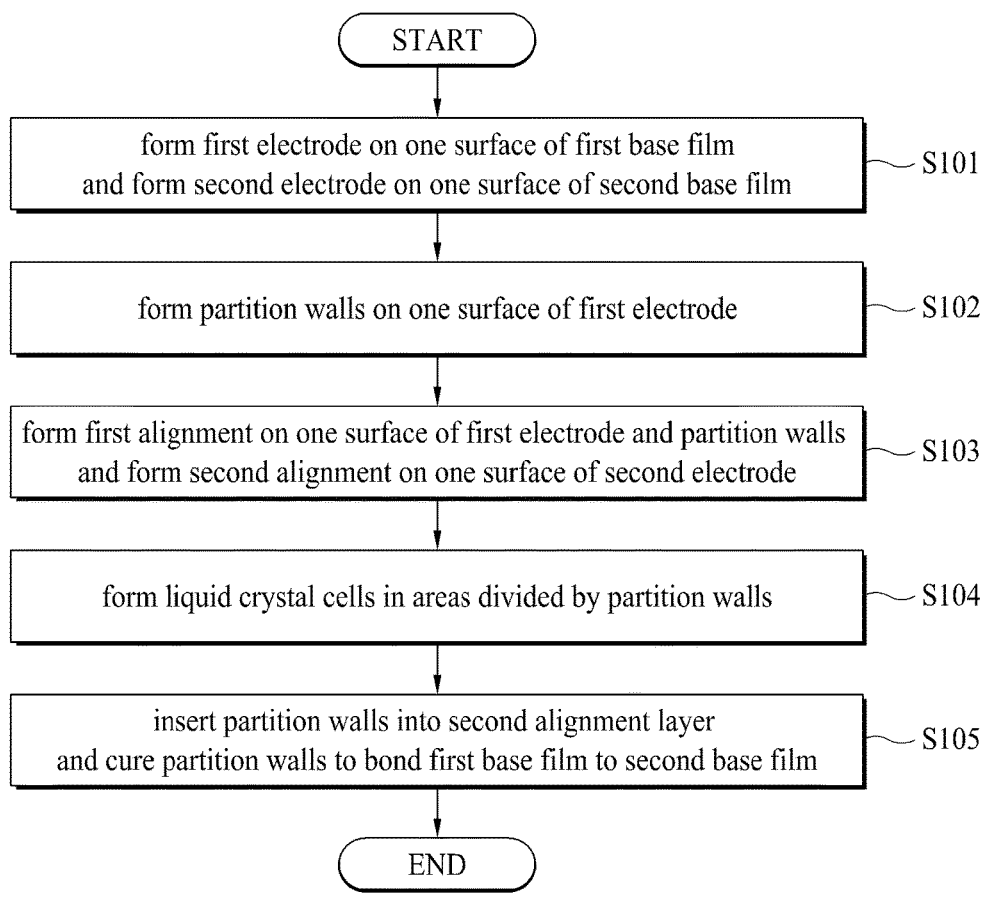
FIG. 14 is a flowchart illustrating a method of manufacturing a light control device according to another embodiment of the present invention.

FIG. 14 is a flowchart illustrating a method of manufacturing a light control device according to another embodiment of the present invention. FIGS. 15A to 15E are cross-sectional views for describing the method of manufacturing the light control device according to another embodiment of the present invention. Hereinafter, the method of manufacturing the light control device according to another embodiment of the present invention will be described in detail with reference to FIGS. 14 and 15A to 15E.

Figure 15A:
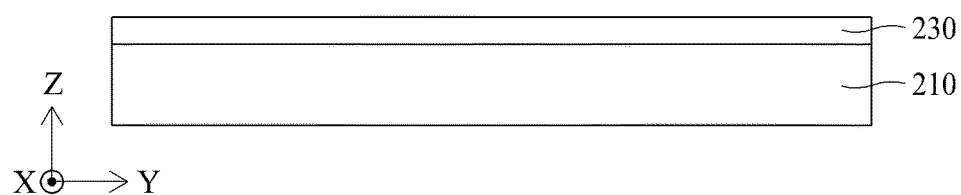
FIGS. 15A to 15E are cross-sectional views for describing a method of manufacturing a light control device according to another embodiment of the present invention.

First, as illustrated in FIG. 15A, the first electrode 230 may be formed on one surface of the first substrate 210, and the second electrode 240 may be formed on one surface of the second substrate 220 facing the first substrate 210. (S101 of FIG. 14)

Figure 15B:
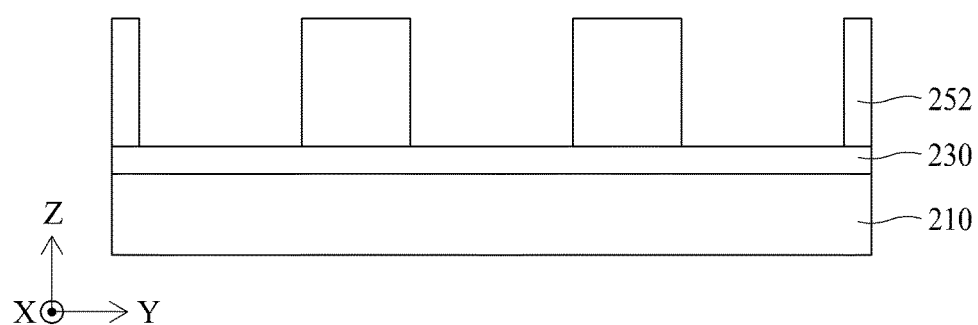

Second, as illustrated in FIG. 15B, the partition walls 252 may be formed on one surface of the first electrode 230. The partition walls 252 may be formed by an imprinting process or a photolithography process.

In a case where the partition walls 252 are formed by the imprinting process, a material included in each of the partition walls 252 may be coated on the one surface of the first electrode 230 facing the second substrate 220, and then, a mold including silicon, quartz, or a polymer material may pressurize the coated material, thereby forming the partition walls 252. In this case, the partition walls 252 may be disposed in correspondence with the emissive areas EA of the transparent display panel 100, and thus, the width of each of the partition walls 252 may be adjusted to a width of each of the emissive areas EA or less.

In a case where the partition walls 252 are formed by the photolithography process, a material included in each of the partition walls 252 may be coated on the one surface of the first electrode 230 facing the second substrate 220, and then, by exposing the coated material through a photo process, the partition walls 252 may be formed.

In a case where the partition walls 252 are formed of a transparent material, the partition walls 252 may each be formed of one of photoresist, a UV curable polymer, and polydimethylsiloxane. Alternatively, the partition walls 252 may each include a material that absorbs light. For example, each of the partition walls 252 may be implemented as a black partition wall. Alternatively, the partition walls 252 may each include a scatter particle that scatters light. The scatter particle may be bids or a silica ball.

Also, the partition walls 252 may be disposed in correspondence with the emissive areas EA of the transparent display panel 100 as illustrated in FIG. 13, and the liquid crystal cells 251 may be disposed in correspondence with the transmissive areas TA of the transparent display panel 100. (S102 of FIG. 14)

Figure 15C:
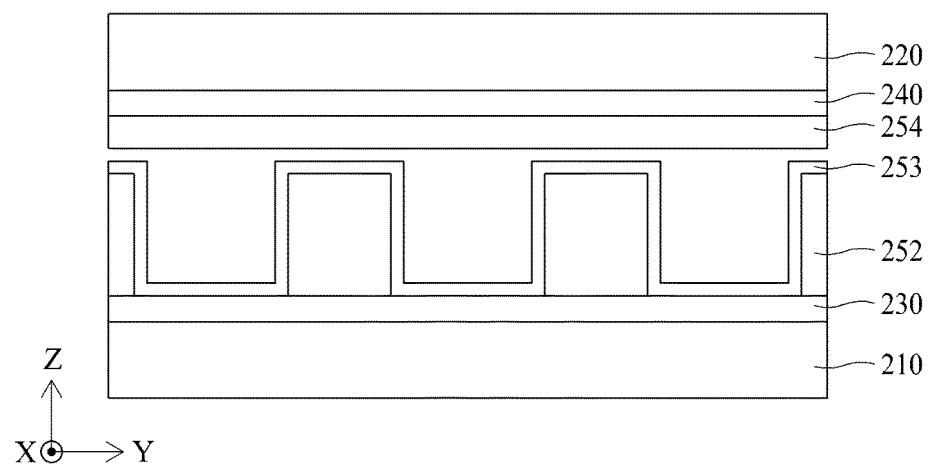

Third, as illustrated in FIG. 15C, the first alignment layer 253 may be formed on the partition walls 252 and the one surface of the first electrode 230, and the second alignment layer 254 may be formed on one surface of the second electrode 240 facing the first substrate 210. Since the partition walls 252 should be inserted into the second alignment layer 254, a thickness of the second alignment layer 254 may be thicker than that of the first alignment layer 253. Polyimide (PI) may be used as the first and second alignment layers 253 and 254. In this case, the second alignment layer 254 may include an adhesive material for increasing an adhesive force between the partition walls 252 and the second alignment layer 254. Each of the first and second alignment layers 253 and 254 may be a vertical alignment layer that allows a long-axis direction of each of the liquid crystal 251a and the dichroic dyes 251b to be aligned in the vertical direction (the Z-axis direction) when a voltage is not applied to the first and second electrodes 230 and 240.

Additionally, hydrophobic processing may be performed on a surface of the second alignment layer 254. Therefore, the liquid crystal cells 251 which are formed in a subsequent process are not adhered to the surface of the second alignment layer 254. (S103 of FIG. 14)

Figure 15D:
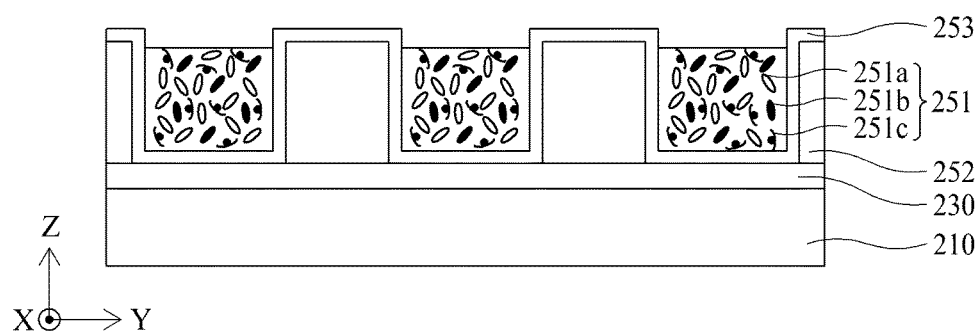

Forth, as illustrated in FIG. 15D, areas divided by the partition walls 252 may be filled with liquid crystal materials, thereby forming the liquid crystal cells 251. In this case, since the partition walls 252 should be inserted into the second alignment layer 254, the liquid crystal cells 251 may be formed so that a top of each of the liquid crystal cells 251 is formed at a position which is lower in height than a top of each of the partition walls 252. The areas divided by the partition walls 252 may be filled with the liquid crystal materials through an inkjet process. The liquid crystal materials may include the liquid crystal 251a, the dichroic dyes 251b, and the ion materials 251c. (S104 of FIG. 14)

Figure 15E:
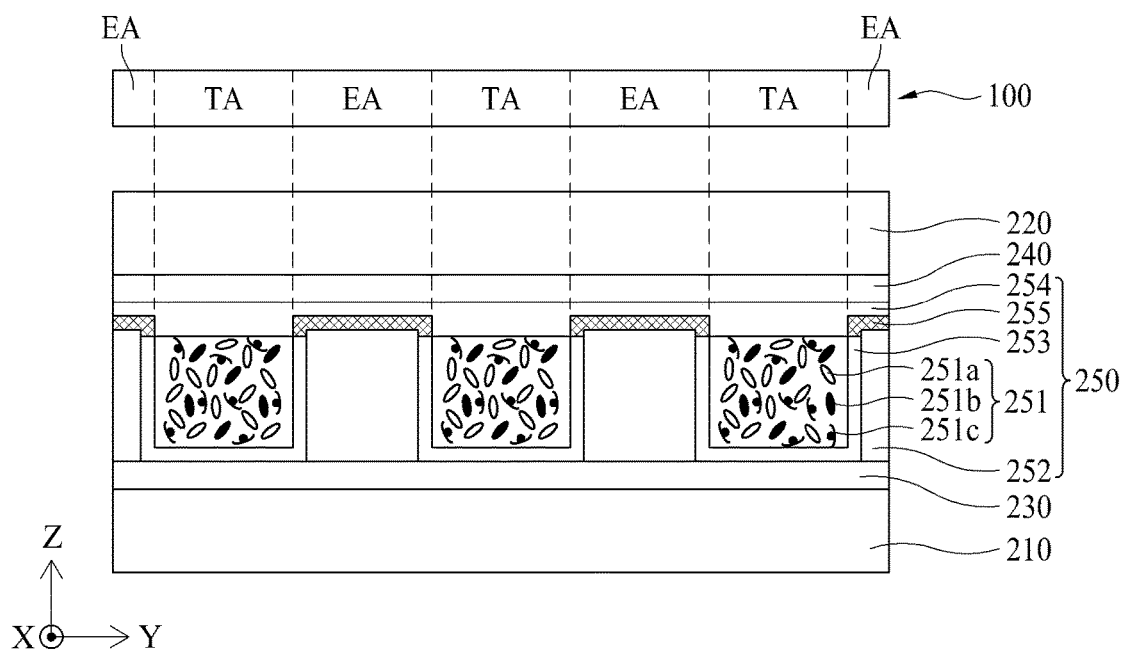

Finally, as illustrated in FIG. 15E, the partition walls 252 may be inserted into the second alignment layer 254 and then may be cured, and thus, the first substrate 210 may be bonded to the second substrate 220. In this case, the partition walls 252 and the first alignment layer 253 formed on the partition walls 252 may be inserted into the second alignment layer 254. In this case, since a thickness of the first alignment layer 253 is thin, the partition walls 252 may be exposed to outside the first alignment layer 253. Therefore, the second alignment layer 254 may be adhered to the partition walls 252, and an adhesive area 255 may be provided between the second alignment layer 254 and the partition walls 252. (S105 of FIG. 14)

According to the present embodiment, the partition walls 252 may be inserted into the second alignment layer 254 including the adhesive material and then may be cured, and thus, the partition walls 252 may be adhered to the second alignment layer 254. Therefore, an adhesive force between the second alignment layer 254 and the partition walls 252 increases, and the first substrate 210 and the second substrate 220 are not separated from each other by an external impact in bonding the first substrate 210 to the second substrate 220. Also, the liquid crystal cells 251 may be moved by external pressure, thereby solving a problem where a light transmittance is reduced in the transmissive mode.

As described above, according to the embodiments of the present invention, a voltage may not be applied to the first and second electrodes in the transmissive mode, and thus, a long-axis direction of each of the liquid crystal and the dichroic dyes may be aligned in the vertical direction (the Z-axis direction of FIG. 14) by the first and second alignment layers. Therefore, the liquid crystal and the dichroic dyes may be aligned in a direction in which light is incident, and thus, the incidences of scattering and absorption of light by the liquid crystal and the dichroic dyes are minimized. Accordingly, most of light incident on the light control device may pass through the liquid crystal cells.

Moreover, according to the embodiments of the present invention, an AC voltage having a certain period may be applied to the first and second electrodes in the light shield mode, and in this case, the liquid crystal and the dichroic dyes may be randomly moved by the ion materials. As a result, light may be scattered by the liquid crystal of the liquid crystal cells or may be absorbed by the dichroic dyes, and thus, most of the light incident on the light control device may be blocked by the liquid crystal cells.

Moreover, in the embodiments of the present invention, since the liquid crystal layer does not include a polymer, a UV curing process of curing a polymer is not performed in manufacturing the light control device. As a result, in an embodiment of the present invention, a problem where a dichroic ratio (DR) of dichroic dyes is lowered because the dichroic dyes are discolored by UV is prevented. Accordingly, in an embodiment of the present invention, a light transmittance based on the light shield mode is further lowered than a case where the light control device is applied to polymer-dispersed LCD devices including liquid crystal and dichroic dyes.

Furthermore, according to the embodiments of the present invention, since each of the partition walls is inserted into the second alignment layer including the adhesive material and then is adhered, an adhesive force between the second alignment layer and the partition walls increases. Therefore, the first substrate and the second substrate are not separated from each other by an external impact in bonding the first substrate to the second substrate. Also, the liquid crystal cells may be moved by external pressure, thereby solving a problem where a light transmittance is reduced in the transmissive mode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light control device comprising:
a first substrate and a second substrate facing each other;
a first electrode on one surface of the first substrate facing the second substrate;
a second electrode on one surface of the second substrate facing the first substrate;
a plurality of partition walls on one surface of the first electrode facing the second substrate, the plurality of partition walls providing a gap between the first substrate and the second substrate; and
a plurality of liquid crystal cells each including liquid crystal, dichroic dyes, and ion materials,
wherein the plurality of liquid crystal cells are divided by the plurality of partition walls, and
when a voltage is not applied to the first electrode and the second electrode, the light control device operates in a transmissive mode, and
when the voltage is applied to the first electrode and the second electrode, the light control device operates in a light shield mode.

2. The light control device of claim 1, further comprising:
a first alignment layer disposed on the one surface of the first electrode and the plurality of partition walls; and
a second alignment layer disposed on one surface of the second electrode facing the first substrate,
wherein:
the plurality of liquid crystal cells are disposed between the first alignment layer and the second alignment layer, and
when a voltage is not applied to the first electrode and the second electrode, a long-axis direction of each of the liquid crystal and the dichroic dyes is aligned in a vertical direction by the first alignment layer and the second alignment layer.

3. The light control device of claim 2, further comprising an adhesive layer provided between the first and second alignment layers.

4. The light control device of claim 1, further comprising:
a first alignment layer provided on the one surface of the first electrode and a side surface of each of the plurality of partition walls; and
a second alignment layer provided on one surface of the second electrode, the second alignment layer including an adhesive material.

5. The light control device of claim 4, wherein the first and second alignment layers are adhered to each other on an upper portion of each of the plurality of partition walls.

6. The light control device of claim 5, wherein the upper portion of each of the plurality of partition walls is partially inserted into the second alignment layer.

7. The light control device of claim 4, wherein a thickness of the first alignment layer is thicker than a thickness of the second alignment layer.

8. The light control device of claim 4, wherein hydrophobic processing is performed on one surface of the second alignment layer facing the first substrate.

9. The transparent display device of claim 8, wherein:
the transparent display panel comprises a plurality of transmissive areas transmitting the incident light and a plurality of emissive areas emitting light,
the plurality of partition walls are disposed at respective positions corresponding to the plurality of emissive areas, and
the plurality of liquid crystal cells are disposed at respective positions corresponding to the plurality of transmissive areas.

10. The light control device of claim 4, wherein the second alignment layer includes nano particles.

11. The light control device of claim 1, wherein each of the plurality of liquid crystal cells further comprises a polymer network scattering incident light.

12. A transparent display device comprising:
a transparent display panel transmitting incident light or displaying an image; and
a light control device on one surface of the transparent display panel, the light control device performing a transmissive mode in which the incident light is transmitted, and a light shield mode in which the incident light is blocked,
wherein the light control device comprises:
a first substrate and a second substrate facing each other;
a first electrode on one surface of the first substrate facing the second substrate;
a second electrode on one surface of the second substrate facing the first substrate;
a plurality of partition walls on one surface of the first electrode facing the second substrate, the plurality of partition walls maintaining a gap between the first substrate and the second substrate; and
a plurality of liquid crystal cells each including liquid crystal, dichroic dyes, and ion materials.

13. The transparent display device of claim 12, wherein the light control device further comprises:

a first alignment layer disposed on the one surface of the first electrode and the plurality of partition walls; and a second alignment layer disposed on one surface of the second electrode facing the first substrate, wherein:

the plurality of liquid crystal cells are disposed between the first alignment layer and the second alignment layer, and when a voltage is not applied to the first electrode and the second electrode, a long-axis direction of each of the liquid crystal and the dichroic dyes is aligned in a vertical direction by the first alignment layer and the second alignment layer.

14. The transparent display device of claim 12, wherein:

when a voltage is not applied to the first electrode and the second electrode, the light control device operates in the transmissive mode, and when the voltage is applied to the first electrode and the second electrode, the light control device operates in the light shield mode.

15. The transparent display device of claim 12, wherein the light control device further comprises:

a first alignment layer provided on the one surface of the first electrode and a side surface of each of the plurality of partition walls; and a second alignment layer provided on one surface of the second electrode, the second alignment layer including an adhesive material.

16. The light control device of claim 15, wherein the first and second alignment layers are adhered to each other on an upper portion of each of the plurality of partition walls.

17. The light control device of claim 16, wherein the upper portion of each of the plurality of partition walls is partially inserted into the second alignment layer.

18. A light control device comprising:

a first substrate and a second substrate facing each other;

a first electrode on one surface of the first substrate facing the second substrate;

a second electrode on one surface of the second substrate facing the first substrate;

a plurality of partition walls on one surface of the first electrode facing the second substrate, the plurality of partition walls providing a gap between the first substrate and the second substrate;

a first alignment layer provided on the one surface of the first electrode and a side surface of each of the plurality of partition walls;

a second alignment layer provided on one surface of the second electrode, the second alignment layer including an adhesive material; and a plurality of liquid crystal cells each including liquid crystal, dichroic dyes, and ion materials, wherein the plurality of liquid crystal cells are divided by the plurality of partition walls.

* * * * *